US011370079B2

(12) United States Patent
Oh et al.

(10) Patent No.: US 11,370,079 B2
(45) Date of Patent: *Jun. 28, 2022

(54) REINFORCEMENT RING FOR CARRIER HEAD WITH FLEXIBLE MEMBRANE

(71) Applicant: Applied Materials, Inc., Santa Clara, CA (US)

(72) Inventors: Jeonghoon Oh, Saratoga, CA (US); Jamie Leighton, Palo Alto, CA (US)

(73) Assignee: Applied Materials, Inc., Santa Clara, CA (US)

(*) Notice: Subject to any disclaimer, the term of this patent is extended or adjusted under 35 U.S.C. 154(b) by 431 days.

This patent is subject to a terminal disclaimer.

(21) Appl. No.: 16/354,072

(22) Filed: Mar. 14, 2019

(65) Prior Publication Data
US 2019/0210181 A1 Jul. 11, 2019

Related U.S. Application Data

(63) Continuation of application No. 14/078,019, filed on Nov. 12, 2013, now Pat. No. 10,532,441.

(60) Provisional application No. 61/731,758, filed on Nov. 30, 2012.

(51) Int. Cl.
| B24B 37/30 | (2012.01) |
| B24B 37/27 | (2012.01) |
| H01L 21/67 | (2006.01) |
| H01L 21/321 | (2006.01) |
| H01L 21/304 | (2006.01) |

(52) U.S. Cl.
CPC .............. B24B 37/27 (2013.01); B24B 37/30 (2013.01); H01L 21/304 (2013.01); H01L 21/3212 (2013.01); H01L 21/67092 (2013.01)

(58) Field of Classification Search
None
See application file for complete search history.

(56) References Cited

U.S. PATENT DOCUMENTS

| 5,738,574 A | 4/1998 | Tolles et al. |
| 6,241,593 B1 * | 6/2001 | Chen ...................... B24B 37/30 |
| | | 451/288 |
| 6,666,756 B1 | 12/2003 | Travis |

(Continued)

FOREIGN PATENT DOCUMENTS

| CN | 101072658 | 11/2007 |
| CN | 101293332 | 10/2008 |

(Continued)

OTHER PUBLICATIONS

Machine Generated English Translation of the abstract and bibliographic data of JP 2005-3447752A. Published Dec. 15, 2005. (Year: 2005).*

(Continued)

*Primary Examiner* — Sylvia MacArthur
(74) *Attorney, Agent, or Firm* — Fish & Richardson P.C.

(57) ABSTRACT

A reinforcement ring can be placed in a carrier head to abut an inner surface of a perimeter portion of a flexible membrane. The reinforcement ring has a substantially vertical cylindrical portion, a flange projecting outwardly from the bottom of the cylindrical portion, and a lip projecting outwardly from a top of the cylindrical portion. The flange projects outwardly farther than the lip.

4 Claims, 3 Drawing Sheets

(56) References Cited

U.S. PATENT DOCUMENTS

| | | | |
|---|---|---|---|
| 6,776,694 B2* | 8/2004 | Zuniga | B24B 37/30 |
| | | | 451/388 |
| 6,857,945 B1 | 2/2005 | Chen et al. | |
| 7,121,934 B2 | 10/2006 | Jung | |
| 7,255,771 B2 | 8/2007 | Chen et al. | |
| 7,303,466 B2 | 12/2007 | Boo et al. | |
| 7,654,888 B2 | 2/2010 | Zuniga et al. | |
| 7,699,688 B2 | 4/2010 | Zuniga et al. | |
| 7,727,055 B2 | 6/2010 | Zuniga et al. | |
| 7,950,985 B2 | 5/2011 | Zuniga et al. | |
| 8,469,776 B2 | 6/2013 | Zuniga et al. | |
| 9,381,613 B2* | 7/2016 | Leighton | B24B 37/30 |
| 10,022,837 B2 | 7/2018 | Chen et al. | |
| 10,052,739 B2 | 8/2018 | Gajendra et al. | |
| 2001/0041526 A1 | 11/2001 | Perlov | |
| 2006/0154580 A1 | 7/2006 | Hung et al. | |
| 2007/0202785 A1 | 8/2007 | Oh et al. | |
| 2009/0242125 A1 | 10/2009 | Paik et al. | |
| 2010/0240287 A1 | 9/2010 | Zuniga | |
| 2010/0311311 A1 | 12/2010 | Paik et al. | |
| 2012/0052774 A1 | 3/2012 | Moriya | |
| 2013/0065495 A1 | 3/2013 | Gajendra et al. | |
| 2013/0316628 A1 | 11/2013 | Jang et al. | |
| 2014/0273776 A1* | 9/2014 | Leighton | B24B 41/061 |
| | | | 451/490 |
| 2019/0210181 A1* | 7/2019 | Oh | B24B 37/27 |

FOREIGN PATENT DOCUMENTS

| | | |
|---|---|---|
| CN | 201168928 | 12/2008 |
| CN | 102172888 | 9/2011 |
| CN | 102227803 | 10/2011 |
| CN | 102246280 | 11/2011 |
| JP | 2003-529457 | 10/2003 |
| JP | 2004-297029 | 10/2004 |
| JP | 2005-347752 | 12/2005 |
| JP | 2006-004993 | 1/2006 |
| JP | 4384993 | 12/2009 |
| JP | 2012-051037 | 3/2012 |
| KR | 10-2002-0094079 | 12/2002 |
| KR | 10-0513573 | 9/2005 |
| TW | I299015 | 7/2008 |
| TW | 200903612 | 1/2009 |
| TW | 200949991 | 12/2009 |

OTHER PUBLICATIONS

Machine Generated English Translation of the specification f JP 2005-3447752A. Published Dec. 15, 2005. (Year: 2005).*

KR Office Action in Korean Application No. 10-2019-7030599, dated Nov. 29, 2020, 6 pages (with English translation).

European Search Report in European Application No. 13858763.9, dated Nov. 11, 2015, 3 pages.

International Search Report in International Application No. PCT/US2013/071334, dated Mar. 12, 2014, 13 pages.

Office Action in Chinese Application No. 201380061923.1, dated Dec. 19, 2016, 13 pages (with English translation).

KR Office Action in Korean Application No. 10-2019-7030599, dated May 28, 2020, 5 pages.

TW Office Action in Taiwanese Application No. 106144996, dated Jun. 19, 2019, 4 pages (with English search report).

KR Office Action in Korean Application No. 10-2019-7030599, dated Mar. 12, 2021 3 pages (with English translation).

* cited by examiner

REINFORCEMENT RING FOR CARRIER HEAD WITH FLEXIBLE MEMBRANE

CROSS-REFERENCE TO RELATED APPLICATIONS

This application is a continuation of U.S. patent application Ser. No. 14/078,019, filed Nov. 12, 2013, which claims priority to U.S. Provisional application Ser. No. 61/731,758, filed on Nov. 30, 2012, each of which is incorporated herein by reference.

TECHNICAL FIELD

The present disclosure relates to a carrier head for chemical mechanical polishing.

BACKGROUND

Integrated circuits are typically formed on substrates, particularly silicon wafers, by the sequential deposition of conductive, semiconductive or insulative layers. One fabrication step involves depositing a filler layer over a non-planar surface and planarizing the filler layer. For certain applications, the filler layer is planarized until the top surface of a patterned layer is exposed. A conductive filler layer, for example, can be deposited on a patterned insulative layer to fill the trenches or holes in the insulative layer. After planarization, the portions of the conductive layer remaining between the raised pattern of the insulative layer form vias, plugs, and lines that provide conductive paths between thin film circuits on the substrate. For other applications, such as oxide polishing, the filler layer is planarized until a predetermined thickness is left over the non-planar surface. In addition, planarization of the substrate surface is usually required for photolithography.

Chemical mechanical polishing (CMP) is one accepted method of planarization. This planarization method typically requires that the substrate be mounted on a carrier head. The exposed surface of the substrate is typically placed against a rotating polishing pad. The carrier head provides a controllable load on the substrate to push it against the polishing pad. A polishing liquid, such as a slurry with abrasive particles, is typically supplied to the surface of the polishing pad. For polishing of a metal layer on a substrate, e.g., a copper layer, the slurry can be acidic.

SUMMARY

The technology node for 150 mm (also termed "6 inch") diameter substrates continues to improve. This generates a need to improve CMP process capability to comply with the ever more stringent requirements for within wafer and wafer-to-wafer uniformity. Although multi-zone carrier heads have been used for larger substrates, e.g., 200 mm and 300 mm diameter substrates, the smaller size of the carrier head for the 150 mm diameter substrate can pose form factor difficulties.

In one aspect, a flexible membrane for a carrier head of a chemical mechanical polisher includes a main portion, an annular outer portion, and exactly three annular flaps to divide a volume above the main portion into a plurality of chambers when the flexible membrane is secured to a carrier head. The main portion has a lower surface to provide a substrate-mounting surface, and the substrate mounting surface has a radius R. The annular outer portion extends upwardly from an outer edge of the main portion and has a lower edge connected to the main portion and an upper edge. The three annular flaps include a first annular flap joined to an inner surface of the main portion at a radial position between 75% and 95% of R, a second annular flap joined to the annular outer portion at a position between the lower edge and the upper edge, the second annular flap extending inwardly from the outer annular portion, and a third annular flap joined to the upper edge of the annular outer portion, the third annular flap extending inwardly from the outer annular portion.

In another aspect, a chemical mechanical polishing head includes a base assembly, a retaining ring secured to the base assembly, and a flexible membrane as described above secured to the base assembly.

Implementations of any of the aspects may include one or more of the following features. The substrate mounting surface may have a radius of about 75 mm. The first annular flap may be joined to the main portion about 10 mm from the outer edge of the main portion. The first annular flap may be joined to the main portion at a radial position between 85% and 90% of R. The first annular flap may include a horizontally extending section and a vertically extending section connecting the laterally extending section to the main portion. A notch may be formed at a junction between the horizontally extending section and the vertically extending section. The horizontally extending section may have a smaller thickness than the vertically extending section. Each of the flaps may have a thickness smaller than a thickness of the main portion. The annular outer portion may include a body having a thickness greater than a thickness of the main portion. A notch may be formed in an interior surface of the body of the annular outer portion at a junction of the body and the main portion. An outer surface of the body may have a recess between a lower edge and an upper edge of the body. The outer surface of the body between the recess and the lower edge may be a single vertical surface. The outer surface of the body between the recess and the upper edge may be a single vertical surface. The outer surface of the body between the recess and the lower edge may be laterally aligned with the outer surface of the body between the recess and the upper edge.

Implementations can include one or more of the following advantages. Within wafer and wafer-to-wafer uniformity can be improved, and the improvement can be extended to 150 mm diameter substrates.

The details of one or more implementations are set forth in the accompanying drawings and the description below. Other aspects, features, and advantages will be apparent from the description and drawings, and from the claims.

DETAILED DESCRIPTION

During a polishing operation, one or more substrates can be polished by a chemical mechanical polishing (CMP) apparatus that includes a carrier head 100. A description of a CMP apparatus can be found in U.S. Pat. No. 5,738,574.

Figure 1:
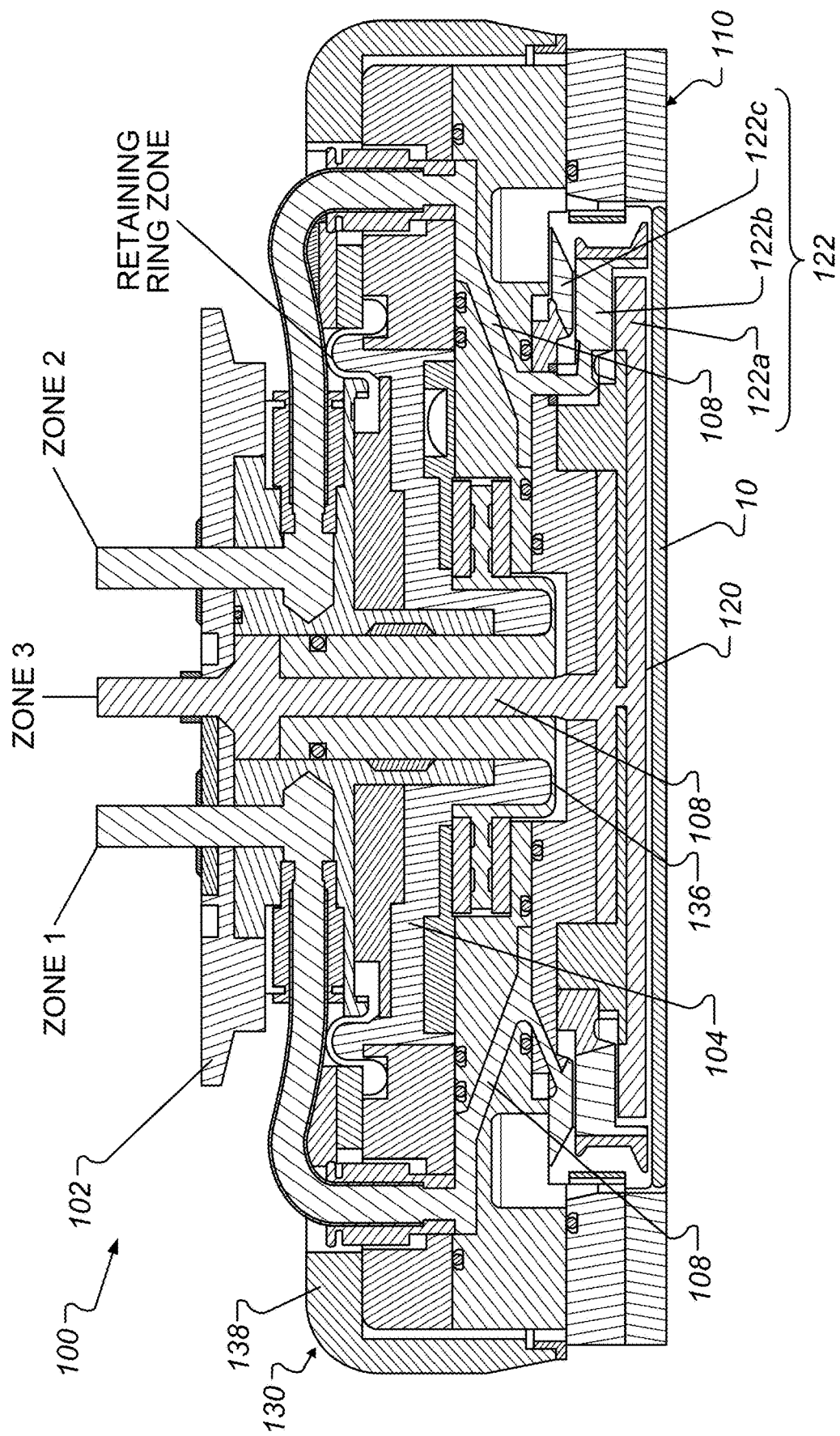
FIG. 1 is a schematic cross-sectional view of a carrier head for a chemical mechanical polishing apparatus.
Figure 2:
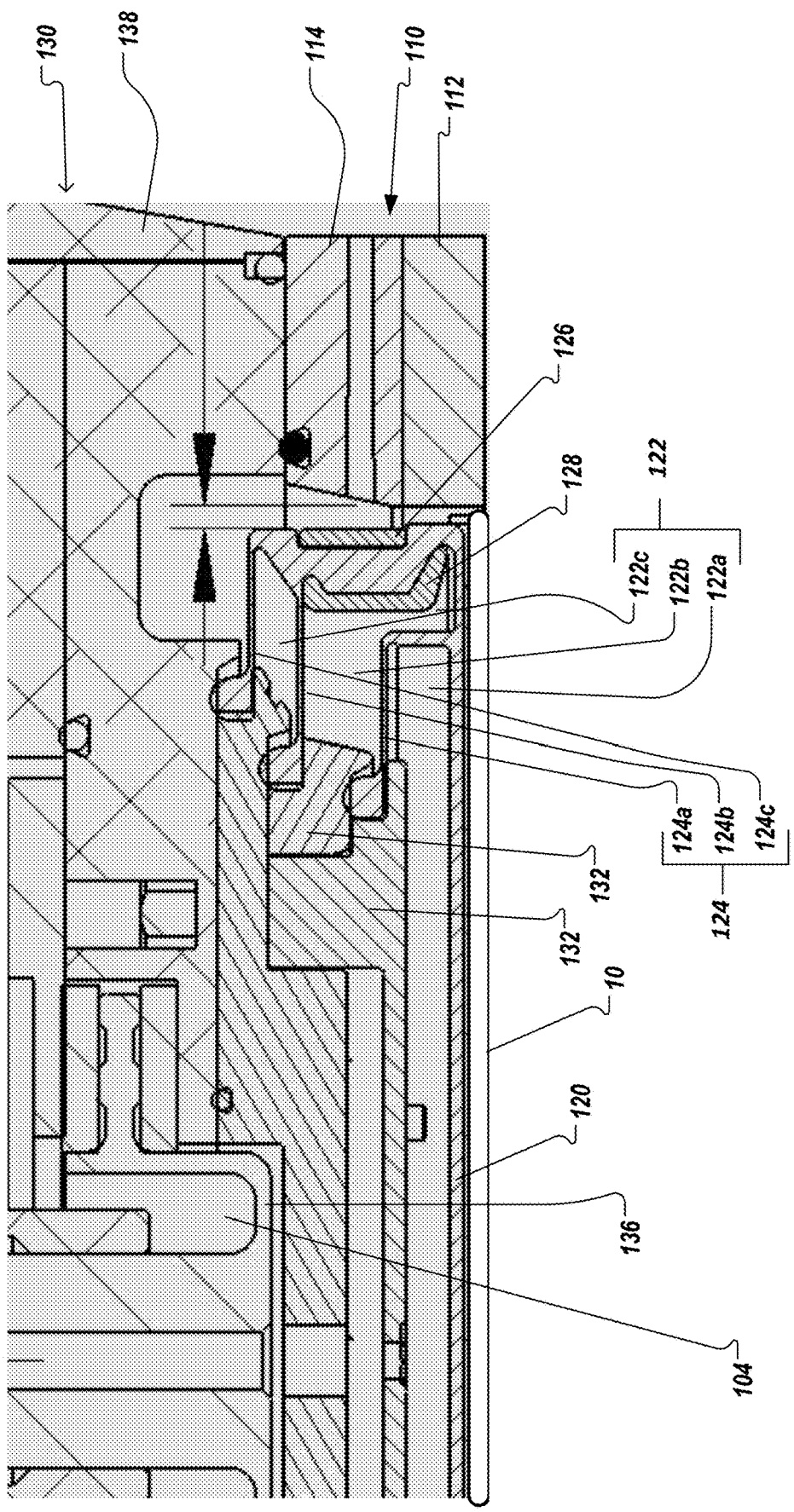
FIG. 2 is an enlarged view of the right hand side of the carrier head of FIG. 1.

Referring to FIGS. 1 and 2, an exemplary carrier head 100 includes a housing 102, a base assembly 130 that is vertically movable relative to the housing 102, a pressurizable chamber 104 between the housing 102 and the base assembly 130 that controls the vertical position or downward pressure on the base assembly 130, a flexible membrane 120 secured to the base assembly 130 with a bottom surface that provides a mounting surface for the substrate, a plurality of pressurizable chambers 122 between the membrane 120 and the base assembly 130, and a retaining ring 110 secured near the edge of the base assembly 130 to hold the substrate below membrane 120. The housing 102 can be secured to a drive shaft, and the drive shaft can rotate and/or translate the carrier head across a polishing pad.

The retaining ring 110 may be a generally annular ring secured at the outer edge of the base assembly 130, e.g., by screws or bolts that extend through aligned passages in the base assembly 130 into the upper surface of the retaining ring 110. An inner surface of the retaining ring 110 defines, in conjunction with the lower surface of the flexible membrane 120, a substrate receiving recess. The retaining ring 110 prevents the substrate from escaping the substrate receiving recess. The retaining ring 110 can include a lower portion 112 and an upper portion 114 that is more rigid than the lower portion 112. The lower portion 112 can be a plastic, such as polyphenylene sulfide (PPS) or polyetheretherketone (PEEK). The lower portion 112 can be substantially pure plastic (consist of plastic), e.g., no non-plastic fillers. The upper portion 114 can be a metal, e.g., stainless steel.

A pressure controller can be fluidly connected to the chamber 104 though a passage in the housing 102 and/or base assembly 130 to control the pressure in the chamber 104 and thus the position of and/or downward pressure on the base assembly 130, and thus the retaining ring 110. Similarly, pressure controllers can be fluidly connected to the chambers 122 though passages 108 in the housing 102 and/or base assembly 130 to control the pressures in the chambers 122 and thus the downward pressures of the flexible membrane 120 on the substrate.

Alternatively, the base assembly 130 and the housing 102 could be combined into a single part (with no chamber 122 and the base assembly 130 not vertically movable relative to the housing 102). In some of these implementations, the drive shaft can be raised and lowered to control the pressure of the retaining ring 110 on the polishing pad. In another alternative, the retaining ring 110 can be movable relative to the base assembly 130 and the carrier head 100 can include an internal chamber which can be pressurized to control a downward pressure on the retaining ring, e.g., as described in U.S. Pat. No. 7,699,688, which is incorporated by reference.

The flexible membrane 120 can be a silicone membrane. The flexible membrane can include multiple flaps 124 that divide the volume between the flexible membrane 120 and the base assembly 130 into individually controllable chambers. The ends of the flaps 124 can be attached to the base assembly 130, e.g., clamped to the base assembly 130.

An annular external ring 126 can be inset into a recess in the outer surface of the outer perimeter portion of the flexible membrane 120. An annular internal ring 128 can abut the inner surface of the of the outer perimeter portion of the flexible membrane 120. The external ring 126 and internal ring 128 increase the rigidity of the perimeter portion of the flexible membrane 120. This can permit pressure in an upper chamber of the multiple chambers to be transmitted through the perimeter portion to the substrate.

The end of each flap can be clamped between clamps 132. The various clamps can be a substantially pure plastic, e.g., polyetheretherketone (PEEK), or polyphenylene sulfide (PPS), a composite plastic, e.g., a glass filled PPS or glass-filled PEEK, or a metal, e.g., stainless steel or aluminum.

A gimbal mechanism 136 (which can be considered part of the base assembly 130) permits the base assembly 130 to slide vertically relative to the housing 102 while restricting lateral motion of the base assembly 130. A cover 138, e.g., formed of semi-crystalline thermoplastic polyester based on polyethyleneterephthalate (PET-P), e.g., Ertalyte™, can be draped over the outer side of the base assembly 130 to prevent contamination from slurry from reaching the interior of the carrier head 100.

Together, the gimbal mechanism 136, various clamps 132, and cover 138, can be considered to provide the base assembly 130.

Figure 3:
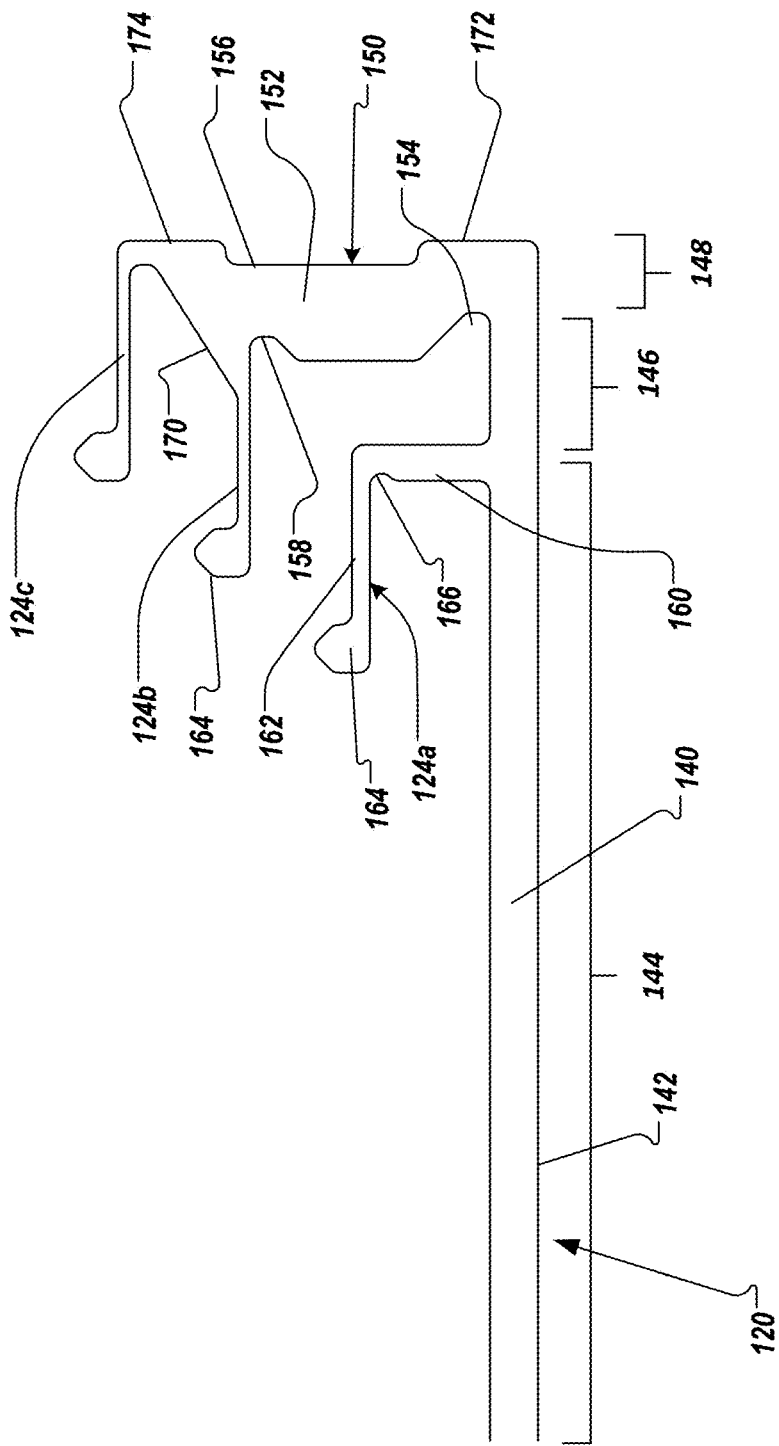
FIG. 3 is a schematic cross-sectional view of a membrane from the carrier head of FIG. 1.

Referring to FIGS. 2 and 3, in some implementations the membrane includes exactly three flaps, including an inner flap 124a, a middle flap 124b, and an outer flap 124c, which define three chambers 122a, 122b and 122c. The first chamber 122a is a generally circular chamber located within the innermost flap 124a. The second chamber 122b is an annular chamber surrounding the first chamber 122a, and is defined by the volume between the innermost flap 124a and the middle flap 124b. The third chamber 122c can be positioned above the second chamber 122b, and is defined by the volume between the middle flap 124b and the outer flap 124c.

As shown in FIG. 3, the flexible membrane 120 can have a generally flat main portion 140 and an annular outer portion 150. The lower surface of the main portion 140 provides a substrate-mounting surface 142. The lower edge of the outer portion 150 is joined to the outer edge of the main portion 140.

The inner annular flap 124a is joined to the upper surface of the main portion 140 of the flexible membrane 120. Thus, the downward pressure on an inner circular portion 144 of the substrate mounting surface 142, located within the region where the inner annular flap 124a is connected to the main portion 140, is controlled primarily by the pressure in the first chamber 122a (see FIG. 2). On the other hand, the downward pressure on an outer annular portion 146 of the substrate mounting surface 142, located between where the inner annular flap 124a is connected to the main portion 140 and the annular outer portion 150 is controlled primarily by the pressure in the second chamber 122b (see FIG. 2).

The inner flap 124a can be joined to the inner surface of the main portion 140 at a radial position between 75% and 95%, e.g., between 80% and 85%, of the radius of the substrate mounting surface 142. For polishing of a 150 mm diameter substrate, the substrate mounting surface 142 (and the main portion 140) can have a radius of about 75 mm. The inner flap 124a can be connected to the main portion 140 at about 10 mm from the edge of the substrate mounting surface. Thus, the inner circular portion 144 can have a radius of about 65 mm, and the outer annular portion 146 can have a width of about 10 mm.

The inner annular flap 124a can include a vertical portion 160 extending upwardly from the main portion 140, and a horizontal portion 162 extending horizontally from the upper edge of the vertical portion 160. The horizontal portion 162 can extend inwardly (toward the center of the carrier head) from the vertical portion 160. The end of the horizontal portion 162 can have a thick rim portion 164 which can be configured to fluidly separate the chambers 122a, 122b when secured to a base assembly 130. For example, assuming the horizontal portion 162 extends inwardly from the vertical portion 160, the thick rim portion 164 can be located at the inner edge of the horizontal portion 162.

In some implementations, the horizontal portion 162 of the inner annular flap 124a can have a smaller thickness than the vertical portion 160. In some implementations, a ratio of the length of the horizontal portion 162 to the length of vertical portion 160 is between about 1.5 and 2.0, such as about 1.66. In some implementations, the vertical portion 160 of the inner annular flap 124a can have a smaller thickness than the main portion 140 of the flexible membrane.

In some implementations, an indentation or notch 166 is formed in the vertical portion 160 of the inner annular flap 124a. The notch 166 can be positioned at the inside corner of the juncture between the horizontal portion 162 and its vertical portion 160. The notch 166 can allow the horizontal portion of the concentric annular flap 124a to flex vertically. However, other positions are possible, e.g., in the middle of the vertical portion 160 or at the junction of the vertical portion 160 to the main portion 140.

The outer portion 150 of the flexible membrane 120 includes a body 152 that extends upwardly from the outer edge of the main portion 140. The body 152 can be thicker than the main portion 140 of the flexible membrane 120. A recess 154 can be formed in the inner surface of the body 152 at the juncture between the body 152 and the main portion 140. This recess 154 can permit the body 152 to pivot more freely relative to the main portion 140.

The annular outer portion 150 can have an annular recess 156 along its outer wall. The annular external ring 126 (see FIG. 2) can be inset into the recess 156. The portion 172 of the outer surface of the body between the recess 156 and the lower edge can be laterally aligned with the portion 174 of the outer surface of the body between the recess 156 and the upper edge The middle annular flap 124b can extend horizontally inward from the annular outer portion 150, e.g., from the inner surface of the body 152. The thickness of the middle flap 124b can be the same as the horizontal portion 162 of the inner flap 124a. The middle flap 124b can be connected to the body 152 at the widest point of the body 152. The inner edge of the middle flap 124b can have a thick rim portion 164 which can be configured to fluidly separate the chambers 122b, 122c when secured to a base assembly 130.

In some implementations, a recess 158 is formed in the inner surface of the body 152 at the juncture between the middle flap 124b and the body 152. The internal ring 128 (see FIG. 2) can abut the outer portion 150 with flanges that extend into the recess 154 and the recess 158.

The outer flap 124c can extend inwardly from the upper edge of the annular outer portion 150. The thickness of the outer flap 124c can be the same as the horizontal portion 162 of the inner flap 124a. The inner edge of the outer flap 124c can have a thick rim portion 164 which can be configured to fluidly separate the third chamber 122c from the environment outside the carrier head when secured to a base assembly 130.

In some implementations, the surface 170 of the outer portion 150 extending between the middle flap 124b and the outer flap 124c is slanted. This slanted surface 170 can provide a triangular cross-section at the top of the outer portion 150.

When the third chamber 122c (see FIG. 2) is pressurized, pressure on the surface 170 is transmitted through the body 152 to apply a pressure on an edge portion 148 substrate mounting surface 142.

The present invention has been described in terms of a number of embodiments. The invention, however, is not limited to the embodiments depicted and described. Rather, the scope of the invention is defined by the appended claims.

What is claimed is:

1. A reinforcement ring for placement in a carrier head to abut an inner surface of a vertical perimeter portion of a flexible membrane having a circular horizontal portion and the vertical perimeter portion extending from an edge of the circular horizontal portion, the reinforcement ring comprising:
    a substantially vertical cylindrical portion configured to contact the inner surface of the vertical perimeter portion of the flexible membrane;
    a flange projecting outwardly from a bottom of the cylindrical portion; and
    a lip projecting outwardly from a top of the cylindrical portion, wherein the flange projects outwardly farther than the lip.

2. The reinforcement ring of claim 1, wherein the flange projects downwardly at a non-zero angle from the vertical cylindrical portion.

3. A carrier head for a chemical mechanical polishing system, comprising:
    a base assembly;
    a retaining ring secured to the base assembly;
    a flexible membrane secured to the base assembly, the flexible membrane including
        a circular horizontal main portion with a lower surface to provide a substrate-mounting surface,
        an annular outer portion having a vertical perimeter portion extending upwardly from an outer edge of the circular horizontal main portion, the annular outer portion having a lower edge connected to the circular horizontal main portion, and an upper edge, and
        a plurality of annular flaps connected to the base assembly to divide a volume between the main portion and the base assembly into a plurality of chambers, the plurality of annular flaps including a first annular flap joined to an inner surface of the circular horizontal main portion; and
    a reinforcement ring including a substantially vertical cylindrical portion abutting an inner surface of the vertical perimeter portion of the annular outer portion, a flange projecting outwardly from a bottom of the cylindrical portion, and a lip projecting outwardly from a top of the cylindrical portion, wherein the flange projects outwardly farther than the lip, and flange and the lip fit into corresponding recesses in the inner surface of the annular outer portion of the flexible membrane.

4. The carrier head of claim 3, wherein the flange projects downwardly at a non-zero angle from the vertical cylindrical portion.

* * * * *